United States Patent [19]

Hawryluk et al.

[11] Patent Number: 5,003,567
[45] Date of Patent: Mar. 26, 1991

[54] SOFT X-RAY REDUCTION CAMERA FOR SUBMICRON LITHOGRAPHY

[76] Inventors: Andrew M. Hawryluk, 2708 Rembrandt Pl., Modesto, Calif. 95356; Lynn G. Seppala, 7911 Mines Rd., Livermore, Calif. 94550

[21] Appl. No.: 308,332

[22] Filed: Feb. 9, 1989

[51] Int. Cl.⁵ .............................. G21K 5/00
[52] U.S. Cl. ........................ 378/34; 378/35; 378/84
[58] Field of Search ............ 378/34, 35, 84, 85, 378/145; 250/492.2; 355/67, 53

[56] References Cited

U.S. PATENT DOCUMENTS

| | | | |
|---|---|---|---|
| 4,184,078 | 1/1980 | Nagel et al. | 378/34 |
| 4,411,013 | 10/1983 | Takasu et al. | 378/34 |
| 4,475,223 | 10/1984 | Taniguchi et al. | 378/34 |
| 4,484,339 | 11/1984 | Mallozzi et al. | 378/34 |
| 4,572,659 | 2/1986 | Omata | 355/67 |
| 4,650,983 | 3/1987 | Suwa | 250/204 |
| 4,737,973 | 4/1988 | Ogawa et al. | 378/84 |
| 4,785,470 | 11/1988 | Wood et al. | 378/84 |
| 4,891,830 | 1/1990 | Iwahashi | 378/34 |

FOREIGN PATENT DOCUMENTS

| | | | |
|---|---|---|---|
| 0066053 | 12/1982 | European Pat. Off. | 355/53 |
| 0109193 | 5/1984 | European Pat. Off. | 378/34 |
| 0252734 | 1/1988 | European Pat. Off. | 378/34 |
| 0048174 | 4/1979 | Japan | 378/85 |
| 0245160 | 10/1986 | Japan | 378/35 |
| 1292600 | 12/1986 | Japan | 378/145 |

Primary Examiner—Carolyn E. Fields
Assistant Examiner—David P. Porta
Attorney, Agent, or Firm—Henry P. Sartorio; L. E. Carnahan; William R. Moser

[57] ABSTRACT

Soft x-ray projection lithography can be performed using x-ray optical components and spherical imaging lenses (mirrors), which form an x-ray reduction camera. The x-ray reduction is capable of projecting a 5x demagnified image of a mask onto a resist coated wafer using 4.5 nm radiation. The diffraction limited resolution of this design is about 135 nm with a depth of field of about 2.8 microns and a field of view of 0.2 cm². X-ray reflecting masks (patterned x-ray multilayer mirrors) which are fabricated on thick substrates and can be made relatively distortion free are used, with a laser produced plasma for the source. Higher resolution and/or larger areas are possible by varying the optic figures of the components and source characteristics.

33 Claims, 4 Drawing Sheets

SOFT X-RAY REDUCTION CAMERA FOR SUBMICRON LITHOGRAPHY

The U.S. Government has rights to this invention pursuant to Contract No. W-7405-ENG-48 between the U.S. Department of Energy and the University of California, for the operation of Lawrence Livermore National Laboratory.

BACKGROUND OF THE INVENTION

The invention relates generally to x-ray lithography and more particularly to soft x-ray projection lithography, and x-ray optical devices for performing same.

After its initial demonstration in 1972, proximity print x-ray lithography (PPXRL) appeared to be the lithography of choice for future submicron work. PPXRL uses "hard" x-rays (wavelengths of 0.3 to 2 nm) to expose a mask consisting of an x-ray absorber pattern (usually gold or tungsten) on an x-ray transparent membrane (silicon, silicon nitride, boron nitride, etc) at some finite distance (5 to 50 microns) from a resist coated wafer. Unfortunately, PPXRL has several fundamental constraints arising from diffraction effects, penumbra and secondary photoelectron range which may limit replications to linewidths greater than 200 nm. Even with these limitations, it appeared that PPXRL would be the primary lithographic tool for linewidths from 200 nm to 1 micron and would meet lithographic needs for many years to come.

However, PPXRL has not reached expectations. There are three primary reasons for this: (1) a high brightness x-ray source was needed to obtain high wafer throughput, (2) the hard x-rays required masks with thick absorber patterns and high-aspect-ratio submicron structures which are difficult to produce and (3) the thin, x-ray transparent membranes have had severe distortion and lifetime problems. While solutions to these problems were pursued, optical lithography has advanced its capabilities so that it can now replicate 500 nm linewidths. This has reduced the immediate need for PPXRL. With the fundamental resolution limitations of PPXRL and some mask issues still unresolved, it is questionable if PPXRL will ever meet original expectations.

New advances in the field of x-ray optics have been responsible for many new x-ray optical components such as normal incidence soft x-ray mirrors, beamsplitters and highly dispersive multilayer mirrors. These new optical components have made it possible to design and build new instruments such as x-ray microscopes, telescopes, waveguides and interferometers. It is highly desirable to apply these new x-ray optical components to produce a soft x-ray projection lithography (XRPL) system which is capable of projecting a magnified or demagnified image of an existing pattern from a mask onto a resist coated substrate.

SUMMARY OF THE INVENTION

Accordingly, it is an object of the invention to provide method and apparatus for performing soft x-ray projection lithography.

It is also an object of the invention to provide a soft x-ray reduction camera which projects a mask pattern onto a resist coated substrate.

It is another object of the invention to use soft x-rays for projection lithography.

It is a further object of the invention to provide method and apparatus for performing submicron, and even sub-100 nm, x-ray lithography.

It is also an object of the invention to provide a soft x-ray reduction camera with 1–10x demagnification.

It is another object of the invention to relax the mask requirements for x-ray lithography.

It is a further object of the invention to provide a soft x-ray reduction camera with high resolution, a large depth of field, and a flat-field image over large areas.

The invention is method and apparatus for performing soft x-ray projection lithography. An x-ray reduction camera is formed of a pair of spherical x-ray mirrors positioned in a spaced apart relationship having a common center of curvature; a camera could also be formed with aspherical mirrors. The convex surface of the shorter radius (primary) mirror and the concave surface of the larger radius (secondary) mirror are coated with periodic multilayers of alternating high index/low index materials, e.g. Cr/C, Mo/Si or B/Ru, to provide high x-ray reflectivity at near normal incidence. A transmissive or reflecting mask is positioned relative to the mirrors so that x-rays incident on the mask are transmitted through or reflected by the mask onto the primary mirror which reflects the x-rays to the secondary mirror which reflects the x-rays to an image plane. A laser generated plasma source or a synchrotron can be used to produce soft x-rays. A condenser system is used to provide uniform illumination of the mask by the source. The transmission mask can be used in an on-axis embodiment in which the mask is aligned on a common axis with the two mirrors, or in an off-axis embodiment which provides higher collection efficiency. A reflection mask off-axis embodiment is preferable since mask requirements are easier, e.g. a patterned multilayer on a thick substrate. The mask substrate is curved to produce a flat image. A resist coated wafer is placed at the image plane so that a reduced image of the mask is transferred thereto.

Using x-ray optical components in accordance with the invention, a soft x-ray reduction camera (XRRC) with 1–10x demagnification and capable of producing sub-100 nm lines can be built. An XRRC has many advantages over a PPXRL system including superior resolution and ease of mask fabrication. In a preferred XRRC design, the x-rays reflect off a mask pattern on a thick substrate rather than transmit through a thin membrane. The mask fabrication technology for the XRRC system has already been demonstrated (the masks are patterned multilayer mirrors). In addition, since the XRRC demagnifies the original mask pattern, optical lithography can be used to generate a mask suitable to produce 100 nm linewidth patterns at the image plane of a 5x reduction system.

BRIEF DESCRIPTION OF THE DRAWINGS

In the accompanying drawings:

FIGS. 5 A, B are graphs of theoretical normal incidence x-ray mirror performance of a C/Cr multilayer.

FIGS. 6 A, B, C compare a conventional x-ray lithography mask, a transmission mask for an x-ray reduction camera, and a reflective mask for an x-ray reduction camera, respectively.

DETAILED DESCRIPTION OF THE PREFERRED EMBODIMENTS

I. GENERAL DESCRIPTION

Figure 1:
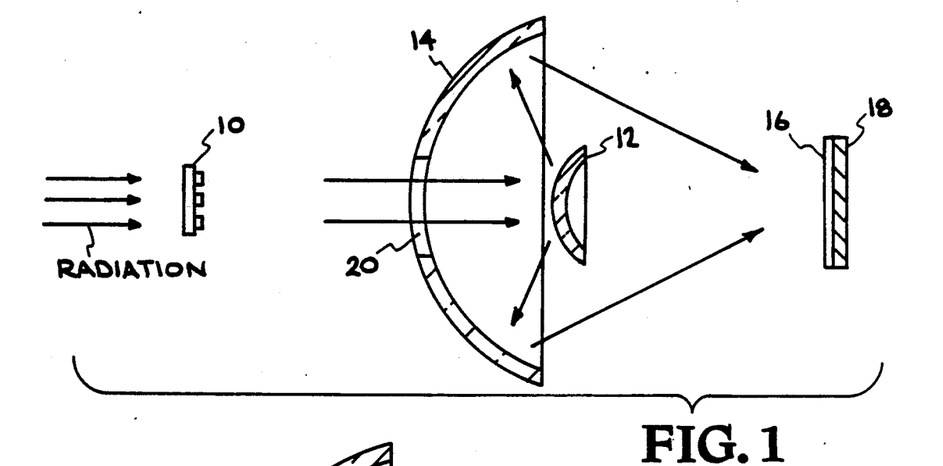
FIG. 1 is a schematic view of an x-ray reduction camera using a transmission mask and on-axis imaging.

The soft XRRC design of the invention utilizes normal incidence reflecting spherical (or aspherical) mirrors for imaging. Normal incidence soft x-ray multilayer mirrors are presently being fabricated. Reflectivities in excess of 50% at 13 nm have been measured and theoretical reflectivities in excess of 75% are predicted at various wavelengths. An initial XRRC design using spherical mirrors and an x-ray transmissive mask is shown in FIG. 1 (the condenser optics and source are not shown) and can be described as an inverse cassegrainian system. A properly designed reduction system with spherical imaging mirrors can be free of all significant wavefront aberration over an extended field of view.

Figure 2:
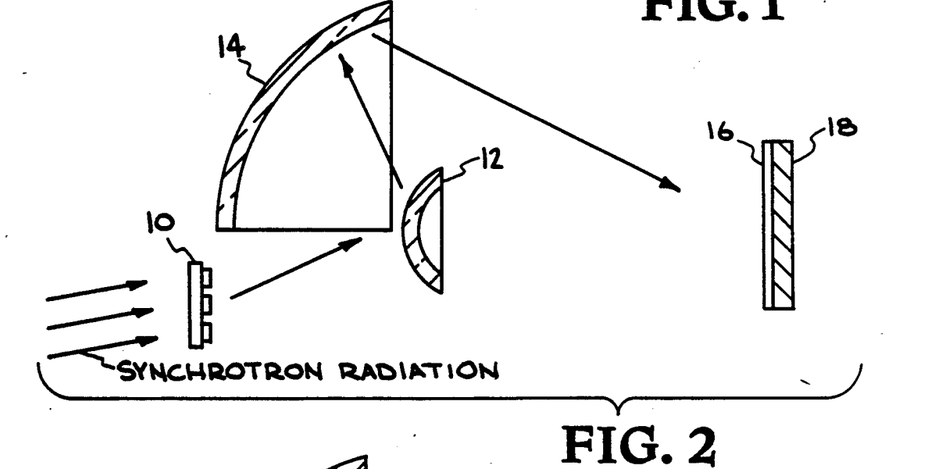
FIG. 2 is a schematic view of an x-ray reduction camera using a transmission mask and off-axis imaging.

In the x-ray reduction camera of FIG. 1, soft x-ray radiation is incident substantially normally to and transmitted through mask 10 onto the convex surface of a primary multilayer spherical x-ray mirror 12 which reflects the x-rays onto the concave surface of a concentric secondary multilayer spherical x-ray mirror 14 which reflects the x-rays to an image plane 16 at which a resist coated wafer 18 is placed. The system of FIG. 1 uses on-axis imaging; secondary mirror 14 is positioned on the axis between mask 10 and primary mirror 12. Aperture 20 is provided in secondary mirror 14 so that x-rays transmitted through mask 10 are incident on primary mirror 12. A variation of the camera of FIG. 1 which utilizes a transmission mask and off-axis imaging is shown in FIG. 2. Mask 10 is placed off-axis so that secondary mirror 14 does not extend into the path between mask 10 and primary mirror 12. The x-ray radiation is incident on mask 10 at an angle so that it is transmitted to primary mirror 12 without having to pass through secondary mirror 14. Mirrors 12, 14 are spherical multilayer x-ray mirrors having a common center so that x-rays from the convex surface of mirror 12 are reflected by the concave surface of mirror 14 to image plane 16 at which resist coated wafer 18 is placed.

Figure 3:
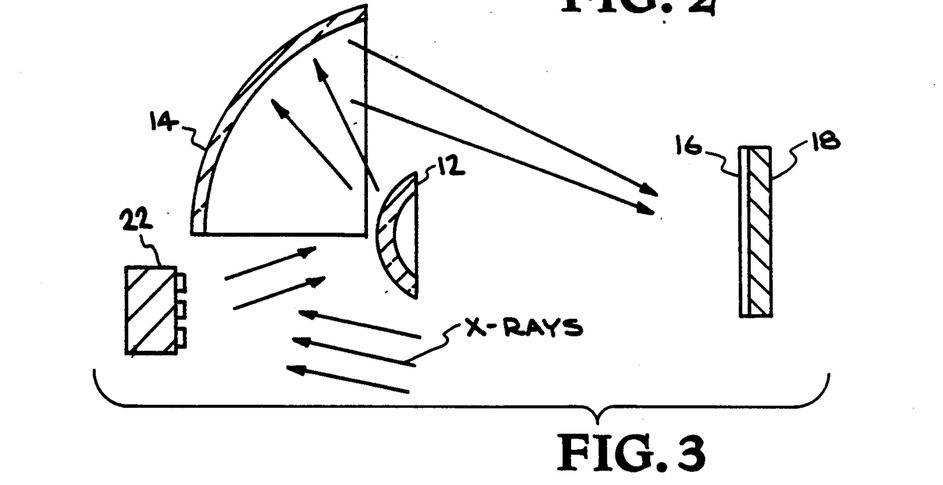
FIG. 3 is a schematic view of an x-ray reduction camera using a reflection mask and off-axis imaging.

A preferred embodiment of the invention is an off-axis imaging camera with reflecting mask as shown in FIG. 3. X-rays are incident at an angle onto a reflecting mask 22 which reflects the x-rays onto the convex surface of a primary multilayer spherical x-ray mirror 12 which reflects the x-rays onto the concave surface of a commonly centered secondary multilayer spherical x-ray mirror 14 which reflects the x-rays to an image plane 16 at which a resist coated wafer 18 is positioned.

The diffracted limited resolution of an imaging system is approximately $1.2 \lambda f\#$. A preferred 5x reduction design will use soft x-rays, because high reflectivity ($R > 50\%$) multilayer coatings are achievable at these wavelengths and the range of secondary photoelectrons (which could degrade the resolution in the exposed resist) is small (about 5 nm). The design (and the invention in general) utilizes 2 nm–250 nm wavelength radiation (particularly 2 nm–150 nm radiation) and normal incidence reflecting optics which are highly reflective for 2 nm–250 nm wavelengths. The inverse cassegrainian system will require an $f\# < 18.5$ at the image plane ($f\# 92.5$ at the object plane) to produce sub-100 nm lines. The depth-of-field ($X(f\#)^2$) at the image plane of this system would be greater than 1 micron.

Figure 4:
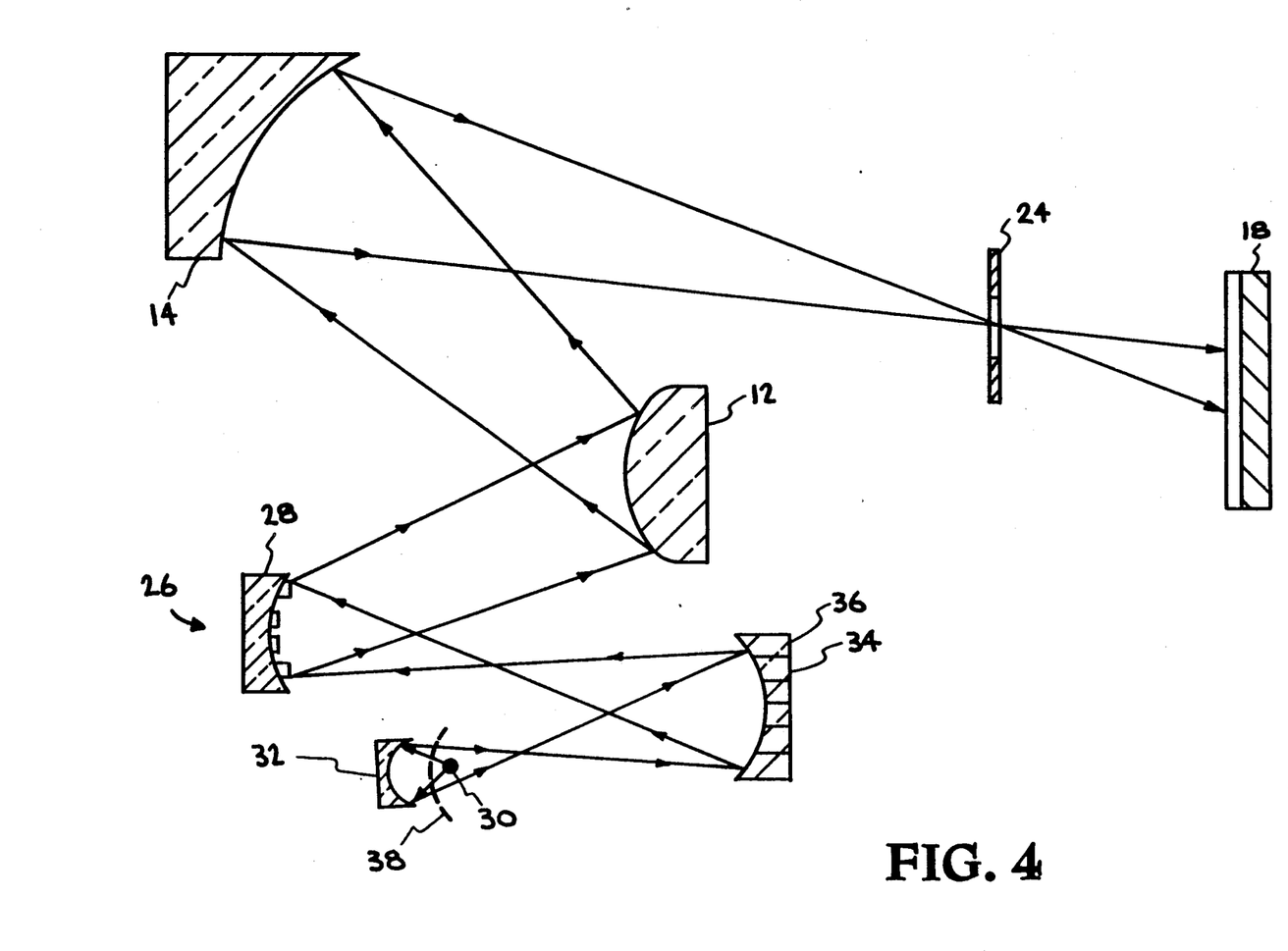
FIG. 4 is a schematic view of the optics of an off-axis reflective mask x-ray reduction camera.

The preliminary design in FIG. 1 has two major limitations which can be easily corrected. The first is that on-axis radiation will travel through the mask, strike the first mirror and be reflected out of the system without being collected by the second spherical mirror. This can lead to non-uniform illumination at the image plane but can be corrected by repositioning the mask and illuminating it at a slight angle, as shown in FIG. 2. The second limitation is a curved image plane due to the spherical optics. Uncorrected, this would limit the field-of-view of the system. A flat-field image plane over large (about cm$^2$) areas is accomplished by using a reflection mask (as shown generally in FIG. 3) comprised of a patterned x-ray multilayer mirror on a curved substrate, as shown in FIG. 4. By appropriately choosing the mask curvature, a flat-field image is obtained with no loss in resolution across the entire image plane. A reflective mask on a thick substrate has several advantages over a transmissive mask on a thin membrane such as: (1) reduced mask distortion; (2) durability (less radiation induced damage); (3) handling ease; (4) better temperature control (efficient cooling) and (5) higher contrast (greater than 1000:1). In addition, a demagnifying XRRC requires a mask with large (about a micron) linewidths and low aspect ratios as compared to the submicron linewidths and high aspect ratios needed for a PPXRL mask, making the mask fabrication for the XRRC relatively easy.

II. ILLUSTRATIVE EXAMPLE - 5x DESIGN preferred and illustrative embodiment of the invention is a 5x demagnifying XRRC suitable for sub-150 nm lithography and large field exposures. This exemplary system has a 0.5 cm diameter (image area = 0.2 cm$^2$) and $f\# = 25$ at the image plane. Theoretically, this system should have a diffraction limited resolution of about 135 nm and a depth-of-field of 2.8 microns for 4.5 nm radiation. Calculations indicate that the field-of-view can be extended to greater than 0.5 cm$^2$ areas without a degradation in resolution. The image area is rectangular because the mask is displaced in one dimension (as shown in FIG. 3). For clarity, the XRRC design is subdivided into the following subsections: (A) Imaging Optics; (B) Multilayer Coatings; (C) X-ray Source; (D) Mask; (E) Condenser Optics and (F) Alignment of Optics. In some instances, the sections are interrelated and design decisions in one section utilize information from other sections.

(A) Imaging Optics

The x-ray imaging and reduction optics are two spherical, multilayer coated mirrors having a common origin or center of curvature, as shown in FIGS. 3, 4. Various combinations of mirror radii can be used to obtain demagnification factors from 1.5 to 1000 with no aberrations up to third order. The primary mirror is the first mirror that x-rays reflected from the mask will strike and the remaining mirror is the secondary mirror. The 5x reduction camera requires a primary mirror with a radius of curvature of 16.66 cm and a secondary mirror with a radius of curvature of 66.66 cm for a mask to primary mirror distance of 50 cm. A small error in the radius of curvature of either mirror will affect the system magnification and the location of the image plane, but will not severely affect system resolution. Therefore, mirrors with slightly incorrect radii of curvature can be used if they are accurately measured.

A 2.5 cm diameter mask requires that the diameter of the primary optic be about 2.5 cm and the diameter of the secondary optic be about 7.5 cm. The system is specifically designed to keep the size of the optics as small as possible. To achieve diffraction limited resolution will require spherical optics with $\lambda/8$ (about 1 nm) figure of merit over the entire imaging surface. Fortunately, optics with about 6 nm figures are commercially available and 1 nm figures appear possible over the small areas required.

The XRRC design places a pupil 24 in the same plane as the center of curvature of the two spherical mirrors 12, 14, as shown in FIG. 4. This correctly balances aberrations over large fields so the resolution over the entire image area is constant. The chief rays are defined as passing through the center of the pupil. Imaging the chief rays to a point will require a mask on a curved substrate, but this will produce a distortion free image in this monocentric system.

(B) Multilayer Coatings

X-ray multilayer mirrors on flat and curved surfaces have been fabricated. These mirrors provide high normal incidence reflectivities ($>50\%$) for soft x-rays (2 nm–250 nm). In brief, alternating layers of high index and low index materials are deposited onto a smooth substrate. The choice of materials is determined by the x-ray wavelength and the thicknesses of the individual layers is determined by the wavelength and the angle of incidence between the radiation and the mirror surface. Multilayer mirrors are defined by their "d-spacing" which is the total thickness of two adjacent layers or one period, and by their "Y" which is the ratio of the thickness of the high index material to the period. A "d-spacing" uniformity better than 0.25% over a 75 mm diameter wafer has been demonstrated and can probably be maintained over much larger areas.

Figure 5A:
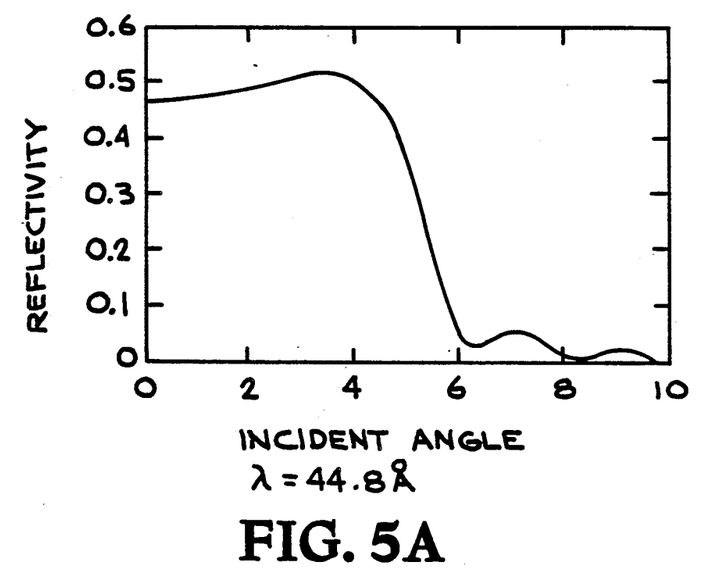
Figure 5B:
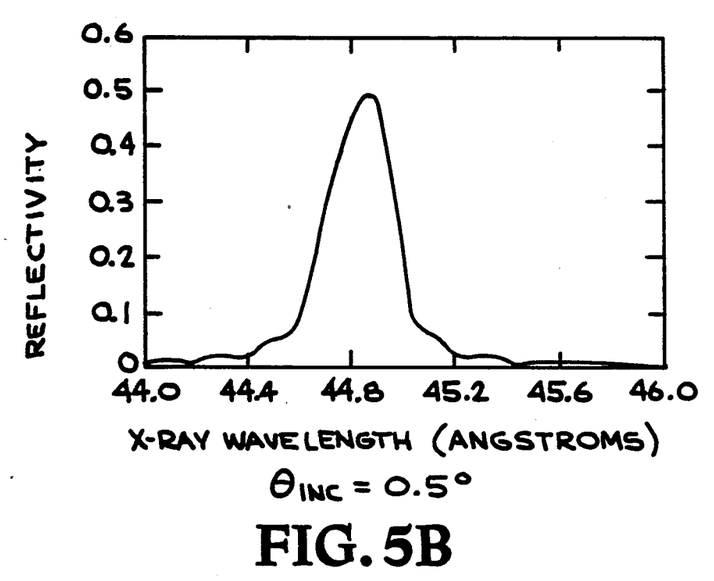

High normal incidence reflectivities ($R>50\%$) at 4.5 nm wavelength are predicted for a carbon and chromium multilayer mirror with a "d-spacing" of about 2.25 nm, Y of about 0.35 (Cr=0.8 nm; C=1.45 nm) and 200 layer pairs, FIGS. 5 A, B. Unfortunately, the spectral bandwidth of this mirror is small ($<1\%$) and may cause practical difficulties in the XRRC (a small error in the "d-spacing" of one mirror relative to the second will reduce the overall system performance). A suitably designed mirror fabrication facility will be able to maintain multilayer "d-spacing" control within this narrow bandwidth.

(C) X-ray Source

A number of different x-ray sources were evaluated and a laser produced plasma source may be the most appropriate. However, other sources such as a synchrotron could also be used. In an ideal imaging system, the entendue (also known as the optical invariant), defined as the product of the collection solid angle, $d\Omega$, and the source size, dA, is conserved. The present design requires that at the final image plane and all intermediate image planes, the entendue is constant. The entendue at the image plane in the XRRC design is:

Entendue $= d\Omega dA = (1.3 \times 10^{-3}) \times (0.2 \text{ cm}^2) = 2.5 \times 10^{-4}$ sr-cm$^2$ where the solid angle, $d\Omega = \pi/4(f\#)^2$). To produce this image, a source with an entendue equal to or greater than the entendue at the image plane is required. A laser produced plasma has a large solid angle ($d\Omega = 2\pi$sr) and can have sufficient entendue for illuminating the reduction camera. A typical laser produced plasma is 100–300 microns in diameter, producing a source entendue of $5 \times 10^{-4}$ to $4 \times 10^{-3}$ sr-cm$^2$. A 300 micron source diameter and a condenser system (FIG. 4) which collects 0.35 sr of the source emission to match the entendue at the image plane are typically used.

Laser produced plasma sources have been well characterized and described. A short pulse laser (usually $<1$ nsec) is focused onto a solid target, typically gold or another high atomic number material. Laser power densities of 2 to $10^{15}$ watts/cm$^2$ on the target will produce a high density, high temperature plasma. The x-ray emission from these plasmas is essentially black-body radiation with characteristic temperatures of 50–200 ev. Shorter wavelength lasers can couple more efficiently to the plasma and heat it more effectively. As a result, much work has been done with YAG lasers (1.06 microns) and through frequency conversion crystals at higher harmonics of the YAG laser (0.53 microns and 0.26 microns). The x-rays are emitted into $2\pi$sr, and the power emitted is given by:

$P(\text{watts/sr}) = 2(kt)(\Delta\lambda)cA/\lambda^4$ where:
$\lambda = 4.5$ nm
$\Delta\lambda = 0.05$ nm
$kt = $ black-body temperature
$c = 3 \times 10^{10}$ cm/sec
$A = $ area In the preferred design, a 10 joule, 1 nsec/pulse YAG laser is focused onto a solid target (300 micron diameter spot size) to produce a power density of $1.4 \times 10^{13}$ watts/cm$^2$. Experiments have shown that, under similar conditions, a plasma whose x-ray emission is characteristic of about a 100 ev black-body radiator ($kt = 1.6 \times 10^{-17}$ joules) will be produced. Using the above equation, the x-ray emission during the time that the laser irradiates the target and within the approximately 1% bandwidth of the multilayer mirrors is about $8 \times 10^7$ watts/sr or about 80 millijoules/sr per laser pulse.

(D) Mask

The masks for the XRRC design will be a patterned x-ray multilayer mirror fabricated on a thick substrate, 2.5 cm in diameter to produce an image area 0.5 cm in diameter. In this design, the mask is part of the condenser system (FIG. 4). A mask on an appropriately curved substrate can eliminate the field curvature at the image plane. The required ideal mask substrate is ellipsoidal with a radius of curvature of 11.08 cm and a conic constant of $-0.69$ (a conic constant of $-1$ defines a parabola). Fortunately, the figure of the ellipsoidal surface must be accurate within the depth-of-field of the imaging system. At the mask, the depth-of-field for the XRRC design is about 70 microns. Such tolerances may allow the surface to be approximated with an appropriate spherical surface.

Molybdenum/silicon x-ray multilayer mirrors have been patterned by a number of techniques to produce highly dispersive multilayer mirrors and this technology will be used to pattern the required x-ray masks. For carbon/chromium multilayer mirrors, it appears that either reactive ion etching or ion beam etching can be used to pattern the multilayer. The most appropriate mask fabrication procedure may be to (1) deposit the multilayer mirror onto the substrate, and (2) pattern the multilayer with a focused ion beam system. This maskless fabrication sequence eliminates any problems with patterning on a curved substrate.

The contrast of the x-ray mask will be determined by the ratio of the x-ray reflectivity from the multilayer mirror surface versus the reflectivity from regions where the mirror is removed (reflectivity from bulk material). At 4.5 nm, the x-ray reflectivity from a polished silicon or glass substrate is less than $10^{-4}$, as compared to a 50% reflectivity from the multilayer mirror. This gives a theoretical mask contrast greater than 1000:1. In practice, mask contrasts of at least about 100:1 are desired. For comparison, in PPXRL, mask contrasts are typically only 10:1. This increase in mask contrast will improve image definition and can relax the requirements on the x-ray resist.

Figure 6A:
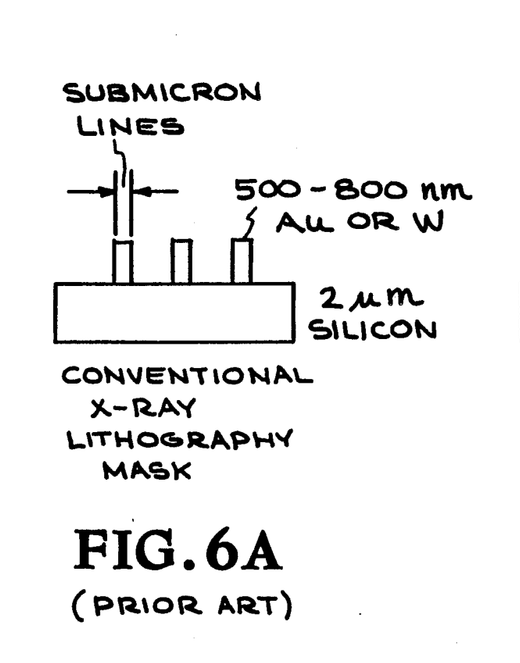
Figure 6B:
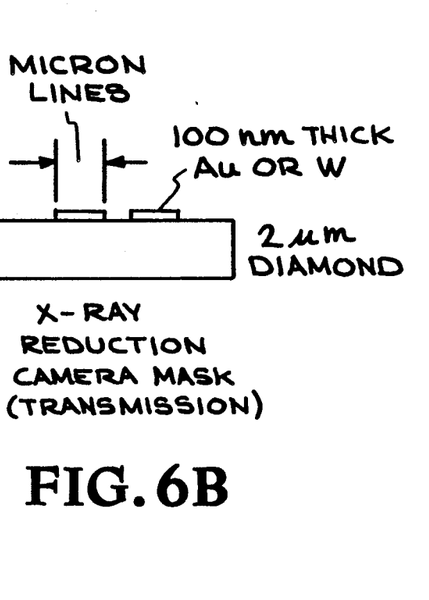
Figure 6C:
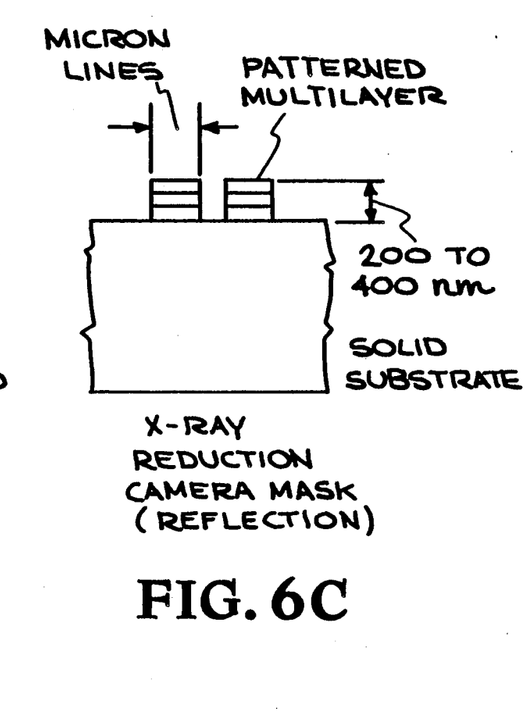

A comparison of a conventional x-ray lithography mask (PPXRL), a transmission mask for reduction camera, and a reflection mask for reduction camera is shown in FIGS. 6 A, B, C. The conventional mask is formed on a thin substrate, e.g. 2 micron Si, with submicron width lines of Au or W with a high aspect ratio of about 3–4, e.g. 0.5–1.0 micron height, with 10:1 contrast for 10 Å x-rays. The XRRC transmission mask has a thin substrate, e.g. 2 micron diamond, with micron width lines of Au or W of low aspect ratio (about 0.1), e.g. 0.1 micron height, with 10:1 contrast for 45 Å x-rays. The reflection mask is the easiest to fabricate, on a thick solid substrate (which may be curved), with micron width lines of patterned multilayers (Cr/C, Mo/Si or B/Ru) 0.2–0.4 microns high, with an aspect ratio of about 0.3 and a contrast of about 1000:1 for 45 Å x-rays.

Exposing large areas (about 1 cm$^2$) and sub-100 nm linewidths will require large masks which must be illuminated with a large range of angles ($> \pm 10°$). Under these conditions, it may be necessary to reduce the number of multilayers on the mask to increase its angular bandwidth because a carbon/chromium multilayer mirror with 200 layer pairs will only reflect x-rays within $\pm 5°$ of normal incidence. A decrease in the number of layers will increase the angular bandwidth with a corresponding loss in peak reflectivity, resulting in an increase in the exposure time. At longer wavelengths, about 13 nm, the angular bandwidth of the mirrors is sufficiently large that this will not be a problem.

(E) Condenser Optics

A condenser system is used to direct an x-ray beam from the x-ray source to the mask. As shown in FIG. 4, the x-ray source (laser produced plasma) 30 is placed at the focus of a primary condenser lens 32 which is formed of a concave spherical x-ray mirror (various x-ray mirrors in the XRRC are sometimes referred to as lenses since they provide the same function). X-rays from source 30 incident on lens (mirror) 32 are reflected onto secondary condenser lens 34 which is formed of a concave spherical x-ray mirror in a spaced relation to primary lens 32. The condenser optics (lenses 32, 34) are positioned so that an x-ray beam from source 30 is directed onto mask 26 from which it is reflected into the camera imaging optics (mirrors 12, 14). The XRRC design employs a Kohler-type condenser system. The advantage of this system over a single lens critical illumination design is that every point in the source fully illuminates the mask and produces a uniform illumination. The disadvantage of the Kohler system is that it requires additional x-ray reflecting surfaces which will increase exposure times because of the finite mirror reflectivities. The condenser lens will need to collect 0.35 sr (f#=1.5) of emitted radiation from the laser produced plasma to match the entendue required at the image plane. At first, this may seem to be a difficult task because a high quality x-ray optic with such a large solid angle has never been fabricated. Fortunately, the resolution of an imaging system is nearly independent of the imaging characteristics of the condenser lens. Therefore, the condenser lens can be fabricated in several small sections 36 and assembled together, FIG. 4. Fabricating the condenser lens in sections has the added advantage that the multilayer "d-spacing" can be varied along the surface of the condenser lens to achieve optimum performance.

FIG. 4 shows one possible condenser lens configuration. Other lens configurations are possible, such as a three lens condenser system, which may have some advantage. A blast-shield 38 between the laser produced plasma and the primary condenser lens protects the condenser lens from debris. The x-rays from the laser produced plasma are re-imaged by the primary lens at an intermediate location between the two lenses and then collected by the second condenser lens and directed onto the mask. Because the mask is an ellipsoid, the second condenser lens should also be an ellipsoid of similar design (radius of curvature=11.08 cm, conic contrast=−0.69). Again, the ellipsoid can be of very poor quality because the resolution of the imaging system is determined only by the final imaging optics. The tolerances on the mask and condenser lens ellipsoids can easily be met with todays technologies.

(F) Alignment of Optics

The spherical imaging optics have a common center of curvature and the multilayer coatings will reflect both x-ray and optical radiation. This feature is critical in that it allows the system to be aligned at visible or near visible wavelengths. A laser interferometer can be used to position a spherical mirror to within a few microns longitudinally and a fraction of a micron laterally. The x-ray imaging optics are mounted on a rotary table whose axis of rotation coincides with the focal point of a long path length focusing interferometer. A small sphere is located on the axis of rotation of the rotary table. This sphere is used to align the interferometer to the center of rotation of the table. The spherical imaging optics are individually aligned to the interferometer by rotating each optic into the interferometer and adjusting the optic until alignment is achieved. In this manner, both imaging mirrors can be accurately positioned with respect to the interferometer focal point. The accuracy of this system is consistent with alignment tolerances of about 10 microns longitudinal and about 3 microns lateral displacement of the primary and secondary imaging mirror centers of curvature.

III. EXPOSURE TIMES

The exposure time will depend upon the x-ray throughput of the imaging system, the number of x-rays produced by the laser produced plasma and the sensitivity of the x-ray resist. The x-ray throughput is defined as the amount of x-ray energy focused in the image field divided by the x-ray energy emitted by the source within the bandwidth of the optics. The x-ray throughput can be calculated based upon the properties of the multilayer mirrors. However, the total amount of x-rays produced by the source will depend upon the target, the power density at the focus and the average power from the laser.

The present design utilizes x-rays generated by the laser produced plasma at 4.5 nm and within a 1% bandwidth. X-rays outside this bandwidth will not be reflected by the mirrors and will not contribute to the image formation. The x-rays within the mirror bandwidth will travel through the blast shield twice (assume 75% transmission per pass), reflect off the two condenser lenses, the x-ray mask and the two imaging lenses to be imaged in the 0.5 cm diameter field (area=0.2 cm$^2$). The XRRC will image about 1.5% (0.55×0.752) of the x-rays that are collected by the first condenser lens within its 0.35 sr solid angle. Assuming that the laser system (10 Joules/pulse) can produce a 300 micron diameter, 100 ev black-body radiator, calculations show that the source will emit 80 millijoules/sr per laser pulse within the desired bandwidth. The optics will collect 0.35 sr and focus 420 microjoules per laser pulse onto the image field. To expose an x-ray resist with a sensitivity of 20 millijoules/cm$^2$ will require 10 laser pulses. Therefore, a 100 watt average power laser will expose the field in 1 second or a 3-inch wafer in 3.8 minutes.

Improvements in exposure times can be realized by increasing the solid angle of the condenser lens or by changing the x-ray wavelength. For example, increasing the collection solid angle to 1 sr will decrease the 3 inch wafer exposure times to about 1 minute. Changing the x-ray wavelength to coincide with higher reflectivity mirrors will also decrease the exposure times. For example, reflectivities in excess of 70% are predicted at a wavelength of 12.4 nm compared to the 50% that are predicted at 4.5 nm. With five reflective surfaces, this increase in reflectivity will decrease the exposure times by more than a factor of five. Together, these two changes could increase the system throughput to five 3-inch wafer exposures per minute. The disadvantage is that, for a fixed f#, the longer x-ray wavelength will decrease the diffraction limited resolution. An XRRC operating with 12.4 nm radiation will need an f# of about 10 at the image plane to obtain equivalent diffraction limited resolution as the system described herein. In addition, the x-ray absorption depth in the resist at this longer wavelength is decreased to about 0.3 microns which will require a bi-level resist process to produce high aspect ratio structures.

IV. CONCLUSION

An x-ray reduction camera utilizing normal incidence spherical x-ray mirrors and a reflective x-ray mask can be used to perform soft x-ray projection lithography. This system should have about 135 nm resolution and a large exposure field. The advantages of the reflective masks on a thick substrate versus a transmissive mask on a thin membrane are many and include stability, durability, ease of handling and fabrication. The technology to build a prototype system for ¼ micron lithography is currently available, although the x-ray imaging mirror substrates need to be improved to produce diffraction limited (sub 100-nm lithography) results.

An alternate design utilizes a flat (planar) x-ray reflecting mask and aspheric imaging lenses to obtain a flat image plane and high resolution. Calculations indicate that the required aspheric surfaces can be easily fabricated by controllably depositing a thin layer of material on a previously measured surface, such as depositing SiO$_2$ onto a polished spherical glass surface in such a way as to obtain the necessary aspheric surface.

Changes and modifications in the specifically described embodiments can be carried out without departing from the scope of the invention which is intended to be limited only by the scope of the appended claims.

We claim:

1. Apparatus for performing soft x-ray projection lithography with soft x-rays of a preselected wavelength comprising:

a reflecting x-ray mask comprising a substrate and a patterned x-ray multilayer mirror formed on the substrate;

substantially normal incidence reflective x-ray imaging means positioned after the mask for projecting an image of the x-ray mask onto an image plane, said imaging means being reflective at the preselected wavelength at substantially normal incidence;

wherein the mask substrate is curved to produce a substantially flat field curvature at the image plane.

2. The apparatus of claim 1 wherein the x-ray imaging means comprises:

a primary mirror having a multilayer x-ray reflecting convex surface;

a secondary mirror having a multilayer x-ray reflecting concave surface;

the primary and secondary mirrors being optically aligned in a spaced relationship so that x-rays incident from the mask at substantially normal incidence to the primary mirror are reflected from the primary mirror to the secondary mirror to the image plane.

3. The apparatus of claim 1 further comprising an x-ray source positioned so that x-rays from the source are incident on the mask.

4. The apparatus of claim 3 wherein the x-ray source is a layer produced plasma source.

5. The apparatus of claim 3 further comprising a near normal incidence, reflection condenser means optically aligned with the source and mask to provide substantially uniform illumination of the mask by the source.

6. The apparatus of claim 1 wherein the mask has a mask contrast of greater than about 100:1.

7. The apparatus of claim 1 wherein the multilayer mirror is selected from C/Cr, Mo/Si, and B/Ru multilayer mirrors.

8. The apparatus of claim 2 wherein the primary and secondary mirrors are substantially spherical.

9. The apparatus of claim 2 wherein the primary and secondary mirrors are substantially aspherical.

10. The apparatus of claim 1 wherein the imaging means has a demagnification in the range of about 1–10X.

11. The apparatus of claim 2 wherein the primary and secondary mirrors are coated with a multilayer selected from a Cr/C, Mo/Si, and B/Ru.

12. The apparatus of claim 3 wherein the source produces x-rays with a wavelength of about 2 nm to about 250 nm.

13. Apparatus for soft x-ray projection lithography with x-rays of a preselected wavelength in the range of 2 nm to 150 nm, comprising:

a reflecting x-ray mask comprising a substrate and a patterned x-ray multilayer mirror formed on the substrate;

a substantially spherical primary mirror having a multilayer x-ray reflecting convex surface having a reflectivity at the preselected wavelength at substantially normal incidence;

a substantially spherical secondary mirror having a multilayer x-ray reflecting concave surface having a reflectivity at the preselected wave length at substantially normal incidence;

the mask, primary mirror and secondary mirror being positioned in a fixed off-axis relationship so that x-rays reflecting by the mask are incident on and reflected by the primary mirror to the secondary mirror and from the secondary mirror to an image plane to project an image of the mask onto the image plane;

wherein the mask substrate is curved to produce a substantially flat field at the image plane.

14. The apparatus of claim 13 further comprising a soft x-ray source positioned in a fixed relationship relative to the mask so that x-rays are incident on the mask.

15. The apparatus of claim 13 wherein the primary and secondary mirrors have a common center of curvature.

16. The apparatus of claim 15 further comprising a pupil placed in the optical path between the secondary mirror and image plane and in the same plane as the common center of curvature of the mirrors.

17. The apparatus of claim 15 further comprising condenser means aligned with the source and mask to provide substantially uniform x-ray illumination of the mask by the source.

18. The apparatus of claim 13 having a demagnification of about 1×10x.

19. The apparatus of claim 13 wherein the mask, primary mirror and secondary mirror are formed of a plurality of alternating layer pairs selected from carbon/chromium, molybdenum/silicon, and boron/ruthenium.

20. The apparatus of claim 14 wherein the x-ray source comprises a laser produced plasma source.

21. Method for performing x-ray projection lithography, comprising:
   forming an x-ray mask with a substrate and a patterned x-ray multilayer mirror on the substrate;
   directing a beam of soft x-rays of a preselected wavelength from as source onto the x-ray mask;
   reflecting the x-rays from the mask;
   imaging x-rays from the mask onto an image plane by an imaging means having a reflectivity at the preselected wavelength at substantially normal incidence;
   wherein the mask substrate is curved to produce a substantially flat field at the image plane.

22. Method of claim 21 further comprising imaging the x-rays from the mask onto an image plane by reflecting the x-rays from the mask from a substantially spherical primary mirror to a substantially spherical secondary mirror to the image plane.

23. Method of claim 22 further comprising positioning the primary mirror and secondary mirror to produce an image demagnification of 1-10x.

24. Method of claim 22 further comprising forming the primary mirror with a multilayer x-ray reflecting convex surface and the secondary mirror with a multilayer x-ray reflecting concave surface, the convex and concave reflecting surfaces having a reflectivity at the preselected wavelength at substantially normal incidence.

25. Method of claim 21 further comprising producing a substantially uniform illumination of the mask.

26. A reflection mask, comprising:
   a curved substrate;
   a patterned multilayer mirror formed on the substrate.

27. The mask of claim 26 wherein the substrate is curved to produce a substantially flat field curvature at an image plane when the mask is imaged onto the image plane by an imaging means positioned after the mask.

28. The mask of claim 26 wherein the mask has a mask contrast of greater than about 100:1.

29. The mask of claim 26 wherein the multilayer mirror is selected from C/Cr, Mo/Si, and B/Ru multilayer mirrors.

30. The mask of claim 26 wherein the patterned multilayer mirror comprises micron width-lines with a height of about 0.2–0.4 microns.

31. The mask of claim 26 wherein the patterned multilayer mirror is reflective at a wavelength in the range of about 2 nm to about 250 nm.

32. The mask of claim 26 wherein the patterned multilayer mirror is reflective at a wavelength in the range of about 4.5 nm to about 13 nm.

33. The mask of claim 26 wherein the patterned multilayer mirror comprises up to about 200 layer pairs of alternating high refractive index and low refractive index layers.

* * * * *